United States Patent
Woelk et al.

(10) Patent No.: US 9,957,612 B2
(45) Date of Patent: May 1, 2018

(54) DELIVERY DEVICE, METHODS OF MANUFACTURE THEREOF AND ARTICLES COMPRISING THE SAME

(71) Applicant: Ceres Technologies, Inc., Saugerties, NY (US)

(72) Inventors: Egbert Woelk, North Andover, MA (US); Ronald L. DiCarlo, Danville, NH (US); Deodatta Vinayak Shenai-Khatkhate, Danvers, MA (US)

(73) Assignee: CERES TECHNOLOGIES, INC., Saugerties, NY (US)

( * ) Notice: Subject to any disclaimer, the term of this patent is extended or adjusted under 35 U.S.C. 154(b) by 138 days.

(21) Appl. No.: 14/567,292

(22) Filed: Dec. 11, 2014

(65) Prior Publication Data
US 2015/0203962 A1 Jul. 23, 2015

Related U.S. Application Data

(60) Provisional application No. 61/928,525, filed on Jan. 17, 2014.

(51) Int. Cl.
| | | |
|---|---|---|
| *C23C 16/44* | (2006.01) | |
| *C23C 16/448* | (2006.01) | |
| *B01B 1/00* | (2006.01) | |

(Continued)

(52) U.S. Cl.
CPC .......... *C23C 16/4482* (2013.01); *B01B 1/005* (2013.01); *B01B 1/06* (2013.01);
(Continued)

(58) Field of Classification Search
CPC .......... C23C 16/4482; C23C 16/45561; C23C 1/4407; B01D 1/14; B01J 4/004; B01J 4/02; B01J 4/002; B01B 1/005; B01B 1/06
See application file for complete search history.

(56) References Cited

U.S. PATENT DOCUMENTS 528,301 A * 10/1894 Montgomery ........ H01L 33/441
  118/405
1,344,423 A   6/1920 Manker
(Continued)

FOREIGN PATENT DOCUMENTS

| EP | 0210476 B1 | 2/1987 |
|---|---|---|
| EP | 0555614 A1 | 8/1993 |

(Continued)

OTHER PUBLICATIONS

"What is an interference fit" Wisegeek published Nov. 25, 2012 and accessed at <https://web.archive.org/web/20121125215701/http://www.wisegeek.com/what-is-an-interference-fit.htm>.*

(Continued)

*Primary Examiner* — Amber R Orlando
*Assistant Examiner* — Stephen Hobson
(74) *Attorney, Agent, or Firm* — Heslin Rothenberg Farley & Mesiti P.C.

(57) ABSTRACT

Disclosed herein is a delivery device comprising a chamber; a gas inlet; a gas outlet; and a dip tube contained within the chamber and having an upper portion and a lower portion, the upper portion of the dip tube being in fluid communication with the gas inlet and being operative to permit the entry of a carrier gas; the lower portion of the dip tube extending into the chamber, the lower portion of the dip tube terminating in an outlet end; and a sleeve; where the sleeve has a first end and a second end; the first end being in an interference fit with the lower portion of the dip tube; and where the sleeve vibrates upon being subjected to a disturbance.

16 Claims, 7 Drawing Sheets

(51) Int. Cl.
  *B01B 1/06* (2006.01)
  *B01J 4/00* (2006.01)
  *C23C 16/455* (2006.01)
  *B01J 4/02* (2006.01)
  *B01D 1/14* (2006.01)

(52) U.S. Cl.
  CPC ............... *B01D 1/14* (2013.01); *B01J 4/002* (2013.01); *B01J 4/004* (2013.01); *B01J 4/02* (2013.01); *C23C 16/4407* (2013.01); *C23C 16/45561* (2013.01); *Y10T 137/0391* (2015.04); *Y10T 137/2076* (2015.04)

(56) References Cited

U.S. PATENT DOCUMENTS

| | | | |
|---|---|---|---|
| 1,770,384 A | 7/1930 | Aske | |
| 1,960,098 A | 5/1934 | Breitenbach | |
| 2,020,038 A | 11/1935 | Moore | |
| 2,219,673 A | 10/1940 | Zenner | |
| 2,264,926 A | 12/1941 | York et al. | |
| 2,750,758 A | 6/1956 | Hoye et al. | |
| 2,755,293 A | 7/1956 | McDonald | |
| 2,836,412 A | 5/1958 | Krieger | |
| 2,896,658 A | 7/1959 | Jones | |
| 3,000,364 A | 9/1961 | Steever | |
| 3,078,529 A | 2/1963 | Cooper et al. | |
| 3,153,439 A | 10/1964 | Golden | |
| 3,398,720 A | 8/1968 | Romanos | |
| 3,407,787 A | 10/1968 | Golden | |
| 3,507,752 A | 4/1970 | Germerdonk | |
| 3,724,530 A | 4/1973 | Latash et al. | |
| 3,728,100 A | 4/1973 | Wooding | |
| 3,965,871 A | 6/1976 | Morton | |
| 3,977,364 A | 8/1976 | Gijsbers et al. | |
| 4,147,035 A | 4/1979 | Moore | |
| 4,167,454 A | 9/1979 | Feres | |
| 4,494,484 A | 1/1985 | Ruzek | |
| 4,506,815 A | 3/1985 | Melas | |
| 4,545,801 A * | 10/1985 | Miyajiri | B01J 4/008 118/693 |
| 4,545,853 A | 10/1985 | Feres | |
| 4,582,480 A | 4/1986 | Lynch et al. | |
| 4,584,064 A | 4/1986 | Ciais et al. | |
| 4,734,999 A * | 4/1988 | Fujisawa | C30B 25/14 261/122.1 |
| 4,861,524 A * | 8/1989 | Sielaff | C03B 37/01413 261/121.1 |
| 4,915,888 A | 4/1990 | Sato | |
| 4,916,828 A * | 4/1990 | Yamane | C23C 16/4481 137/268 |
| 4,919,304 A * | 4/1990 | Markowicz | C23C 16/4482 222/3 |
| 5,078,922 A * | 1/1992 | Collins | B01F 3/022 261/124 |
| 5,139,999 A * | 8/1992 | Gordon | C23C 16/404 427/126.3 |
| 5,199,603 A | 4/1993 | Prescott | |
| 5,224,202 A | 6/1993 | Arnold et al. | |
| 5,254,219 A | 10/1993 | Feres | |
| 5,356,487 A | 10/1994 | Goldstein et al. | |
| 5,363,694 A | 11/1994 | Grabowski | |
| 5,380,367 A | 1/1995 | Bertone | |
| 5,476,547 A | 12/1995 | Mikoshiba | |
| 5,520,858 A * | 5/1996 | Yamaguchi | B01D 1/0076 261/122.1 |
| 5,552,181 A | 9/1996 | Kondoh | |
| 5,709,586 A * | 1/1998 | Maier | C25D 1/10 451/28 |
| 5,755,885 A | 5/1998 | Mikoshiba | |
| 5,776,255 A | 7/1998 | Asaba et al. | |
| 5,862,605 A | 1/1999 | Horie et al. | |
| 5,951,923 A | 9/1999 | Horie et al. | |
| 5,974,077 A | 10/1999 | Abiko | |
| 6,074,545 A | 6/2000 | Ginatta | |
| 6,101,316 A | 8/2000 | Nagashima et al. | |
| 6,135,433 A | 10/2000 | Nurmi | |
| 6,195,504 B1 | 2/2001 | Horie et al. | |
| 6,202,591 B1 | 3/2001 | Witzman et al. | |
| 6,269,221 B1 | 7/2001 | Horie et al. | |
| 6,270,839 B1 | 8/2001 | Onoe et al. | |
| 6,282,368 B1 | 8/2001 | Horie et al. | |
| 6,283,066 B1 | 9/2001 | Nurmi | |
| 6,367,414 B2 | 4/2002 | Witzman et al. | |
| 6,505,469 B1 | 1/2003 | Drube et al. | |
| 6,561,498 B2 * | 5/2003 | Tompkins | B01F 3/04007 261/124 |
| 6,637,475 B2 | 10/2003 | Noah et al. | |
| 6,699,524 B2 * | 3/2004 | Kesala | C23C 16/4481 427/248.1 |
| 6,799,440 B2 | 10/2004 | Zeng et al. | |
| 7,011,299 B2 | 3/2006 | Curran | |
| 7,025,337 B2 | 4/2006 | Curran | |
| 7,464,917 B2 | 12/2008 | Lee et al. | |
| 7,601,225 B2 | 10/2009 | Tuominen et al. | |
| 7,641,737 B2 | 1/2010 | Yi | |
| 7,699,295 B2 | 4/2010 | Lee et al. | |
| 7,736,399 B2 | 6/2010 | Ravenda et al. | |
| 7,775,508 B2 | 8/2010 | Choi et al. | |
| 7,851,019 B2 | 12/2010 | Tuominen et al. | |
| 8,128,073 B2 | 3/2012 | Gregg | |
| 8,272,626 B2 | 9/2012 | Cunning | |
| 8,555,809 B2 | 10/2013 | Woelk | |
| 9,133,836 B2 * | 9/2015 | Bailey | C23C 16/4412 |
| 2002/0152809 A1 * | 10/2002 | Shirai | C23C 16/4482 73/299 |
| 2003/0132257 A1 | 7/2003 | Fiebig | |
| 2003/0235389 A1 | 12/2003 | Kang | |
| 2004/0000164 A1 | 1/2004 | Stach et al. | |
| 2004/0016404 A1 | 1/2004 | Gregg et al. | |
| 2004/0200413 A1 * | 10/2004 | Lee | C23C 16/455 118/715 |
| 2006/0037540 A1 * | 2/2006 | Woelk | C23C 16/4481 118/726 |
| 2007/0022953 A1 | 2/2007 | Choi et al. | |
| 2007/0079759 A1 | 4/2007 | Lee et al. | |
| 2008/0166880 A1 | 7/2008 | Levy | |
| 2008/0251016 A1 | 10/2008 | Cunning | |
| 2009/0114157 A1 | 5/2009 | Lee et al. | |
| 2010/0320205 A1 | 12/2010 | Aranda Campin | |
| 2011/0171383 A1 | 7/2011 | Woelk et al. | |
| 2011/0256313 A1 | 10/2011 | Shenai-Khatkhate | |
| 2011/0311726 A1 | 12/2011 | Liu | |
| 2012/0042838 A1 | 2/2012 | Ieki | |
| 2012/0153048 A1 | 6/2012 | Gregg et al. | |
| 2014/0193578 A1 * | 7/2014 | Birtcher | C23C 16/448 427/248.1 |

FOREIGN PATENT DOCUMENTS

| | | | |
|---|---|---|---|
| EP | 0752558 A2 | 1/1997 | |
| EP | 0849375 A2 | 6/1998 | |
| EP | 1329540 A2 | 7/2003 | |
| GB | 2223509 A | 4/1990 | |
| GB | 2224218 A | 5/1990 | |
| JP | 53064670 A | 6/1978 | |
| JP | H0331477 A | 2/1991 | |
| JP | H06196414 A | 7/1994 | |
| JP | 10085581 A | 4/1998 | |
| JP | 10147870 A | 6/1998 | |
| JP | 01208448 A | 8/1998 | |
| JP | 2011167680 A | 9/2011 | |
| KR | 20080020289 A | 3/2008 | |
| TW | 201144658 | 12/2011 | |
| WO | WO2011097100 A1 | 8/2011 | |
| WO | WO-2011097100 A1 * | 8/2011 | ............ B01B 1/005 |
| WO | WO 2011097100 A1 * | 8/2011 | ............ B01B 1/005 |

OTHER PUBLICATIONS

"Sulfamate nickel to fight corrosion" Electro-Coatings published Oct. 22, 2012 accessed at <https://web.archive.org/web/

(56) References Cited

OTHER PUBLICATIONS

20121022141201/http://www.electro-coatings.com/sulfamate-nickel-corrosion-resistance.php>.*
"Vaporstation (TM) Central Vapor Delivery System Information Manual" Jul. 2009; Dow Electronic Materials Metalorganics (11 pages).
"Vaporstation (TM) Delivery System: A Central Delivery System for MOCVD Precursors" Dow Electronic Materials; ME05N050, Rev. 6; Aug. 2009; www.rohmhaas.com (4 Pages).
Ashino, et al, Refining metal to a high degree of purity with the metal melted under vacuum in a preheated vessel and crucible which prevents oxidation., Derwent, 1998-195474, Patent Assignee: Shinko Electric Co., Ltd, Copyright 2013 Thomson Reuters, (3 pages).
European Search Report for Application No. 11150646.5, dated Feb. 1, 2012, 3 pages.
Vahlas, C. et al. "Fluidized bed as a solid precursor delivery system in a chemical vapor deposition reactor" J. Electrochem. Soc., copyright 2005, The Electrochemical society. (8 pages).
Extended European Search Report and Opinion for EP Application No. 15151100.3; Report dated Jun. 23, 2015 (8 pages).

\* cited by examiner

DELIVERY DEVICE, METHODS OF MANUFACTURE THEREOF AND ARTICLES COMPRISING THE SAME

CROSS-REFERENCE TO RELATED APPLICATIONS

This disclosure claims the benefit of U.S. Provisional application No. 61/928,525 filed on Jan. 17, 2014, the entire contents of which are hereby incorporated by reference.

BACKGROUND

This disclosure relates to a delivery device, methods of manufacture thereof and to articles comprising the same. In particular, this disclosure relates to a high output, high capacity delivery device for delivering liquid precursor compounds in the vapor phase to reactors.

Semiconductors comprising Group III-V compounds are used in the production of many electronic and optoelectronic devices such as lasers, light emitting diodes (LEDs), photodetectors, and the like. These devices comprise different monocrystalline layers with varying compositions and with thicknesses ranging from fractions of a micrometer to a few micrometers. Chemical vapor deposition (CVD) methods using organometallic compounds are generally employed for the deposition of metal thin-films or semiconductor thin-films, such as films of Group III-V compounds. Such organometallic compounds may be either liquid or solid.

In CVD methods, a reactive gas stream is generally delivered to a reactor to deposit the desired film for electronic and optoelectronic devices. The reactive gas stream is either a neat gas or is composed of a carrier gas, such as hydrogen, saturated with precursor compound vapor. When the precursor compound is a liquid, a reactive gas stream is obtained by passing (i.e. bubbling) a carrier gas through the liquid precursor compound in a delivery device (i.e. a bubbler).

Figure 1:
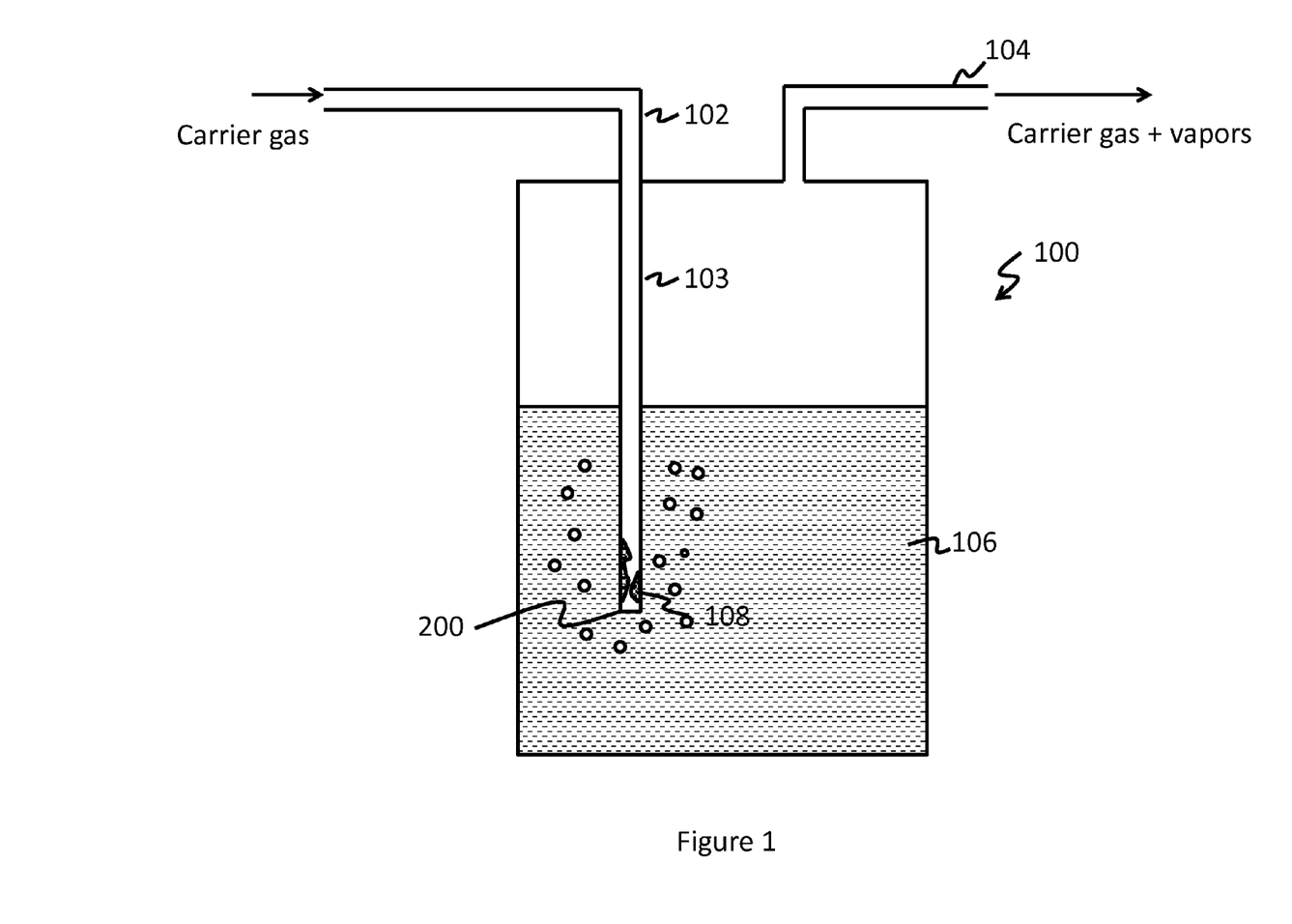
FIG. 1 depicts a commonly used method of transporting precursor vapors from a delivery device 100 to a reactor (not shown)

FIG. 1 depicts a commonly used method of transporting precursor vapors from a delivery device 100 to a reactor (not shown). A dip tube 103 connected to the inlet 102 is used to transport the carrier gases into the liquid precursor 106, while an outlet 104 is used to transport the carrier gas along with the precursor vapors to the reactor. The flow of the carrier gas through a simple butt-ended dip tube 103 produces buffeting at the end of the dip tube 200 (sometimes referred to as an injector). The buffeting produces splash back of the precursor into the dip tube causing a constant wetting of the inner dip tube surface near the end of the dip tube. Many precursors are oxygen and moisture sensitive and tend to form a solid reactive product 108 when exposed to the residual moisture and oxygen present in even the highest purity carrier gas. During use, the reactive product 108 builds up on the inside of the dip tube 103. For example, when the liquid contained in the delivery device 100 is trimethyl gallium, a solid crust of gallium hydroxide/gallium oxide reaction product 108 is produced on the inner surface of the dip tube 103. As the amount of the reactive product 108 deposited on the inner surface grows larger, it constricts the flow path of the carrier gas and eventually impedes the flow of the carrier gas through the delivery device 100. This is particularly a concern in permanently installed delivery devices that are continuously fed from a reservoir as described in U.S. Pat. No. 8,555,809 to Woelk et al.

EP0210476A1 to Markowicz attempts to prevent the formation of large bubbles and favor the formation of small bubbles by redesigning the bottom of the dip tube. It teaches that the dip tube may be suitably machined at its lower end to provide a plurality of openings, for example, cut up into the sidewalls thereof such that a plurality of small gas bubbles exits from the dip tube. The shape of the opening(s) may be varied to suit requirements which might differ with various materials to be used. Alternatively, the bottom portion of the dip tube may be sintered, resulting in a plurality of openings therein of small diameter. It details sealing the lower end of the dip tube and providing one or more small openings therein and/or in the lower portion of the dip tube. The dip tube extends to the bottom of the cylinder and one or more openings are provided in the lower portion of the dip tube.

It is therefore desirable to have alternative designs for the tips of dip tubes for delivery devices that prevent the build-up of reactive products on the inside surface of the dip tube.

SUMMARY

Disclosed herein is a delivery device comprising a chamber; a gas inlet; a gas outlet; and a dip tube contained within the chamber and having an upper portion and a lower portion, the upper portion of the dip tube being in fluid communication with the gas inlet and being operative to permit the entry of a carrier gas; the lower portion of the dip tube extending into the chamber, the lower portion of the dip tube terminating in an outlet end; and a sleeve; where the sleeve has a first end and a second end; the first end being in an interference fit with the lower portion of the dip tube; and where the sleeve vibrates upon being subjected to a disturbance.

Disclosed herein too is a method comprising discharging through a dip tube, a carrier gas into a delivery device that comprises a chamber; a gas inlet; a gas outlet; and a dip tube contained within the chamber and having an upper portion and a lower portion, the upper portion of the dip tube being in fluid communication with the gas inlet and being operative to permit the entry of a carrier gas; the lower portion of the dip tube extending into the chamber, the lower portion of the dip tube terminating in an outlet end; and a sleeve; where the sleeve has a first end and a second end; the first end being in an interference fit with the lower portion of the dip tube; and where the sleeve vibrates upon being subjected to a disturbance; promoting vibration in the sleeve as the carrier is discharged from the perforated member; and transporting the carrier gas from the gas outlet to a site external to the delivery device.

DETAILED DESCRIPTION

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items. As used herein, "substrate" refers to any surface upon which a metal-containing film is deposited by vapor deposition.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Disclosed herein are delivery devices comprising dip tubes that are fitted with a vibration-capable sleeve at the lower end. The sleeve is produced from a material that can easily undergo vibration upon being subjected to a disturbance. The sleeve can comprise a metal, a ceramic or a polymer and has dimensions that permit it to easily vibrate upon being disturbed but returns to its original shape when the disturbance is removed. While not wishing to be bound by theory, it is believed that the vibration-capable sleeve vibrates upon being disturbed (by either the emanation of gas bubbles (into the surrounding media) from the bottom of the sleeve and because of buffeting produced by the emanation of these bubbles) and this vibration prevents the build-up of reaction solids on the inside of the sleeve and/or the dip tube.

In an embodiment, the sleeve has a slotted opening from which a carrier gas enters the delivery device. The slots are open ended, i.e., they are not bounded by a surface at the bottom. The slots are operative to confine the carrier gas flow to make it stable and eliminate liquid buffeting and splash-back, thereby also preventing the build-up of reactive products on the inner surfaces of the dip tube. In one embodiment, the sleeve (that contacts the dip tube) is designed to minimize the liquid buffeting and splash-back that occurs in conventional butt-ended tubes. An incidental consequence of this sleeve design is that the sizes of the carrier gas bubbles that emanate from the sleeve are reduced. The outlet of the sleeve has slots in its periphery that permit the carrier gas to escape in the form of a multitude of smaller bubbles rather than in the form of one large bubble (from a sleeve or dip tube that does not have slots). The discharge of the carrier gas flow through individual slots facilitates a reduction in the amount of buffeting that occurs at the sleeve (or dip tube) outlet, which in turn reduces the splashing of the liquid precursor onto inner surfaces of the sleeve or dip tube of other commercially available devices. This reduction in the splashing minimizes the surface that is alternately wetted and then dried by exposure to the carrier gas. This results in elimination or reduction of the build-up of solid reaction products in an area of the dip tube that would otherwise clog and impede the flow of the carrier gas.

Figure 2:
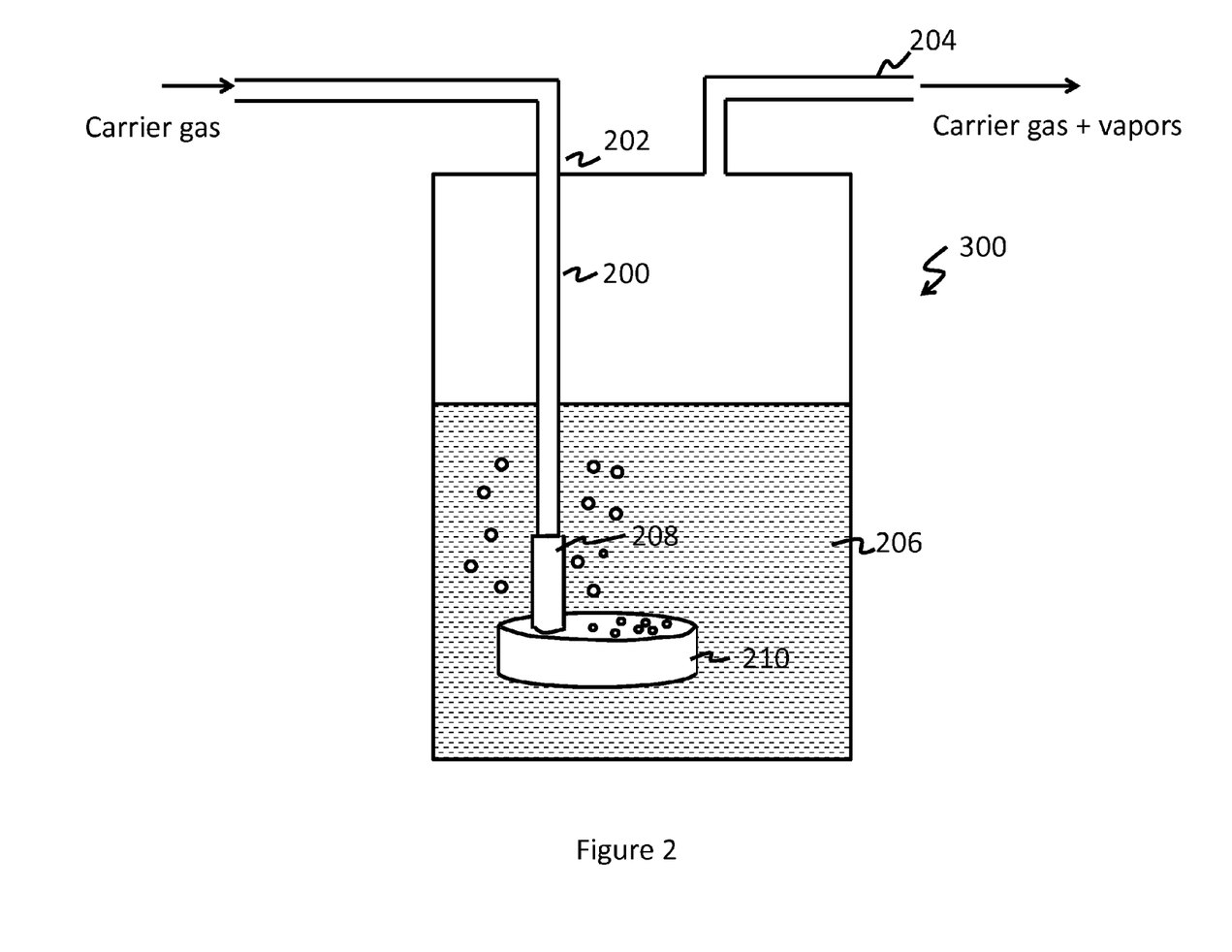
FIG. 2 depicts an exemplary delivery device where the dip tube has a sleeve that facilitates vibration.
Figure 3:
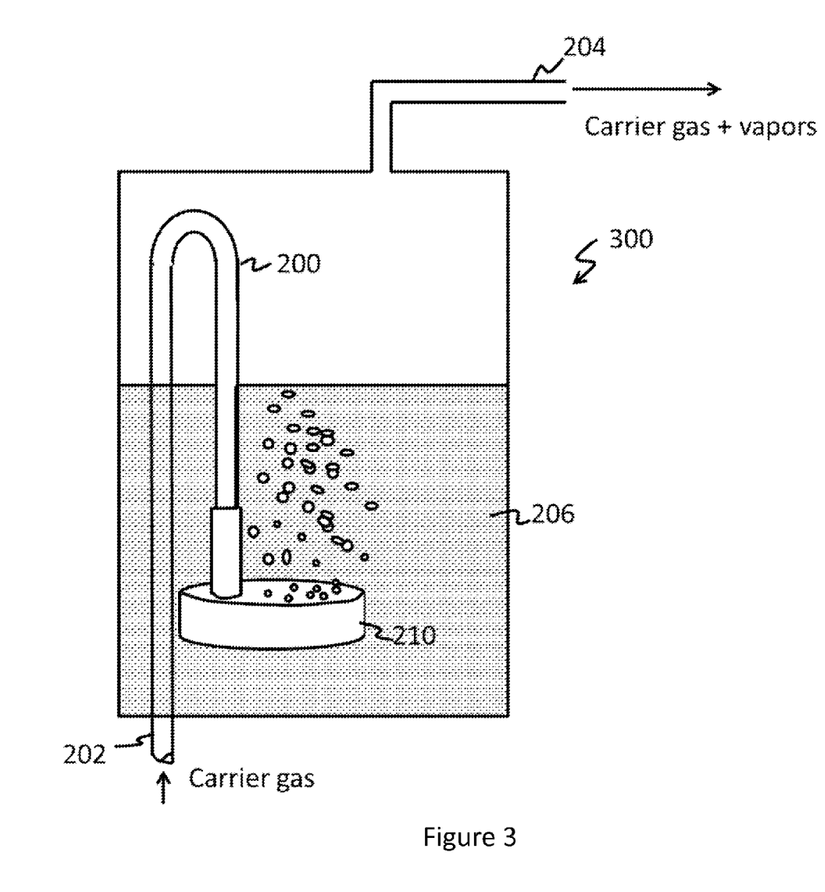
FIG. 3 depicts another exemplary delivery device where the dip tube has a sleeve that facilitates vibration.

In one embodiment, the dip tube is in fluid communication with a sleeve which optionally is itself in fluid communication with a perforated member through which the carrier gas is discharged. The FIGS. 2 and 3 depict embodiments that show exemplary delivery devices 300 for discharging a carrier gas through the delivery device that contains a liquid precursor. As seen in the FIGS. 2 and 3, the dip tube 200 contacts the delivery device 300 at the inlet 202. The dip tube 200 is in fluid communication with a sleeve 208 that contacts the optional perforated member 210. The carrier gas is discharged from the optional perforated member 210 into the delivery device 300. As can be seen in the FIGS. 2 and 3, the bottom of the sleeve as well as the perforated member 210 lie below the surface of the liquid precursor 206 contained in the delivery device.

The dip tube 200 is generally manufactured from a metal, a ceramic, a polymer, or a combination thereof and can enter the delivery device at the inlet port 202 located in either the roof or the floor of the delivery device. Dip tubes may be suitably constructed from polyperfluorinated alkenes such as poly(tetrafluoroethylene) (TEFLON™), quartz, nickel, and metal alloys such as stainless steel (304, 304 L, 316, 316 L, 321, 347 and 430), and nickel alloys such as INCONEL™, MONEL™, HASTELLOY™.

In the FIG. 2, the dip tube 200 enters the delivery device from the roof, while in the FIG. 3 it enters the delivery device from the floor. As can be seen, when the dip tube 200 enters from the floor it has an inverted U-shape. In an embodiment, the dip tube 200 preferably comprises a metal and more preferably comprises a rigid metal. In an exemplary embodiment, the dip tube 200 is manufactured from stainless steel tubing. The dip tube 200 generally has an inner diameter of 2 to 20 millimeters, preferably 4 to 15 millimeters and more preferably 5 to 8 millimeters. The wall thickness of the dip tube 200 is 0.5 to 2.5 millimeters, preferably 0.7 to 2.0 millimeters and more preferably 1.0 to 1.5 millimeters.

In one embodiment, the sleeve 208 contacts the end of the dip tube 200. The sleeve 208 can be manufactured from a metal, a ceramic, a polymer or a combination thereof. It is desirable for the material used in the sleeve to be inert to the carrier gas as well as to the precursor. The sleeve should not be dissolved or degraded by either the carrier gas or the precursor. The sleeve 208 is strong enough (i.e., it has a high enough ultimate tensile strength and ultimate shear strength) to handle vibrations due to disturbances (in the surrounding fluid such as buffeting in the dip tube 200 that accompanies the discharge of the carrier gas) without being damaged or destroyed over long periods of time but is also flexible enough (e.g., has a low enough elastic modulus) return to its original shape after the disturbance is removed. The metal is therefore preferably a ductile metal at room temperature. In one embodiment, the sleeve 208 comprises a metal such as nickel, copper, aluminum, stainless steel, titanium, cobalt, or the like, or a combination comprising at least one of the foregoing metals. In an exemplary embodiment, the sleeve comprises electroformed nickel having a very small wall thickness. The very low thickness of the metal sleeve facilitates its ability to undergo vibration upon being disturbed. When manufactured from a metal, the sleeve 208 has a wall-thickness of 0.020 millimeters to 0.070 millimeters, preferably 0.030 millimeters to 0.060 millimeters and more preferably 0.035 to 0.055 millimeters.

In another exemplary embodiment, the sleeve 208 may be manufactured from an elastomer. In one embodiment, the elastomers may be crosslinked. In another embodiment, the elastomer can be obtained by physical constriction of some of the polymer chains by crystalline domains, glassy domains, ionic domains, or combinations thereof. Examples of suitable elastomers are polybutadiene, polyisoprene, styrene-butadiene rubber, nitrile rubber (which is a copolymer of butadiene and acrylonitrile), hydrogenated nitrile rubbers, butyl rubber, halogenated butyl rubbers, silicones, fluorosilicones, fluoroelastomers, perfluoroelastomers, polyether block amides, or the like, or a combination comprising at least one of the foregoing elastomers. Sleeves manufactured from elastomers may have wall-thicknesses that are greater than the wall-thicknesses of sleeves manufactured from metals or ceramics.

As can be seen in the FIGS. 2 and 3, the sleeve 208 contacts the end of the dip tube 200. A first end of the sleeve 208 is fixedly attached to the end of the dip tube 200 via an interference fit (also known as a press fit or a friction fit). The interference fit between the sleeve and the dip tube may be accomplished via the use of force or by using thermal expansion (where the sleeve is heated and disposed on the dip tube) and subsequent contraction (where the sleeve is cooled causing it to contract onto the dip tube). In an embodiment, the other end of the sleeve 208 can be open ended (i.e., it is not sealed at the bottom nor does it have any barriers to flow) and is not connected to any other device. This embodiment is depicted in the FIG. 4(A).

Figure 4A:
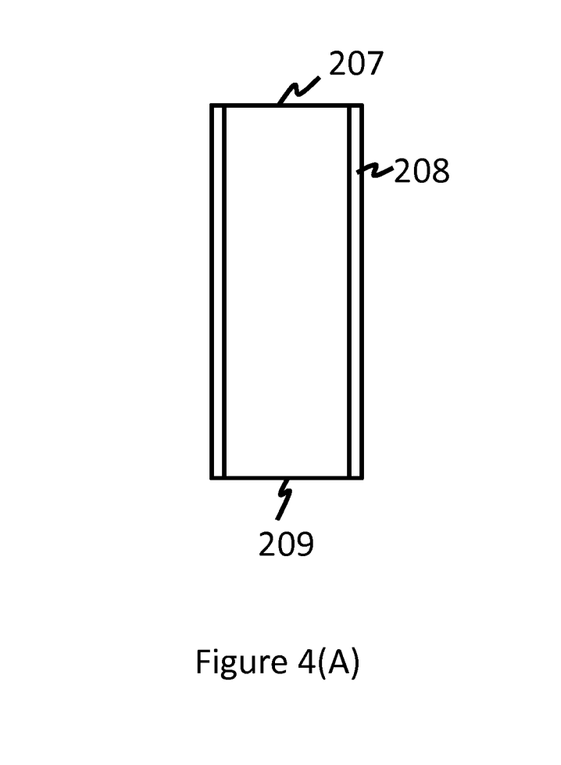
FIG. 4(A) depicts an exemplary view of a cross-section taken along a vertical central axis of the sleeve.

The sleeve 208 depicted in the FIG. 4(A) comprises a first end 207 and a second end 209. The first end 207 is in an interference fit with the dip tube 200, while the second end 209 is open ended and lies beneath the surface of the liquid precursor (not shown) in the delivery device. The second end 209 of the sleeve 208 may also have slots or serrations that will be detailed later in the FIGS. 5 through 7.

Figure 4B:
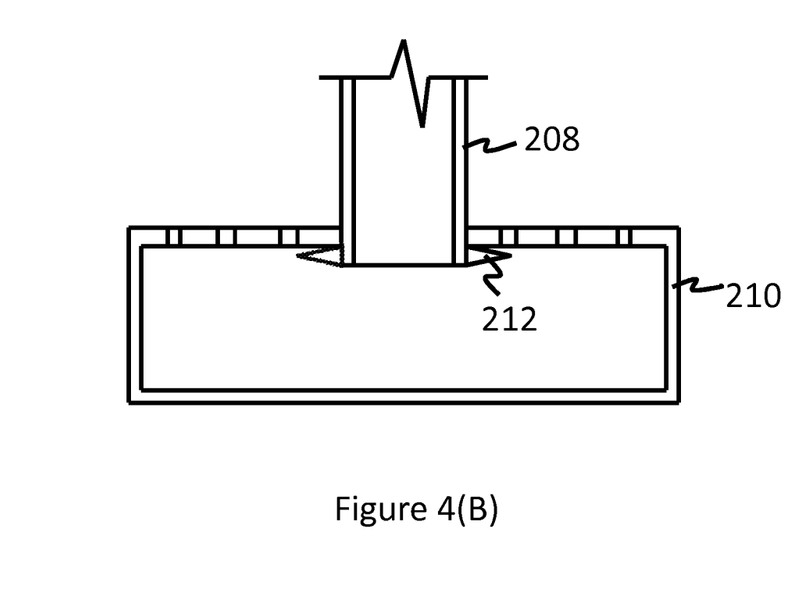
FIG. 4(B) depicts an exemplary view of a cross-section taken along a vertical central axis of the sleeve when it contacts the perforated member.

The FIG. 4(B) depicts another embodiment where the sleeve 208 is in contact with the optional perforated member 210. In an embodiment, the perforated member may be a foam, an inverted shower head, or the like, or a combination thereof. In an exemplary embodiment, the perforated member 210 is an inverted shower head. The perforated member 210 may contact the sleeve 208 via an interference fit or by being supported on a ledge 212 mounted on the sleeve 208. In another embodiment, the perforated member 210 may be supported on the floor of the delivery device 300 while the sleeve is in fluid communication with the perforated member via a port (not shown). When an inverted shower head is used as the perforated member, the pores are on the surface of the shower head that faces the roof of the chamber. The discharged carrier gas therefore flows from the pores in the shower head towards the roof of the chamber.

The inverted shower head is fixedly attached to the opposing end of the sleeve from the end that contacts the dip tube. In other words, a second end of the sleeve 208 (that is opposed to the first end) is attached to the perforated member 210 via an interference fit or loose fit. The interference fit between the sleeve and the dip tube may be accomplished via the use of force (forcing the perforated member onto the sleeve) or by using thermal expansion and subsequent contraction (if the perforated member is being first expanded so that it fits around the sleeve and then contracted to fit tightly onto the sleeve) or by using contraction followed by thermal expansion (if the sleeve is being first contracted to slide into a port in the perforated member followed by thermal expansion to obtain an interference fit between the sleeve and the perforated member). A loose fit allows the limited vibration of the sleeve and deformation by the perforated member. In another embodiment the perforated member or the dip tube may be induced to vibrate on its own by suitable means other than the buffeting of the gas bubbles.

In another embodiment, depicted in the FIG. 4(B), the perforated member 210 is mounted on the sleeve 208 via a ledge 212 that is fixedly attached to the sleeve 208. The FIG. 4(B) depicts a cross-section taken along the central axis of the sleeve 208 and the perforated member 210. The action of gravity permits the perforated member to remain in contact with the ledge 212. This arrangement does not use an interference fit and permits the perforated member to free-float around the second end of the sleeve. In yet another embodiment (not shown here), the bottom of the perforated member lies on the floor of the delivery device, while the sleeve enters a port (not shown) in the perforated member. The port in the perforated member is generally located on an upper surface of the perforated member, but can be located on its circumferential surface as well. This arrangement also does not use an interference fit and permits the perforated member to free-float around the second end of the sleeve.

The dip tube along with the sleeve attached thereto may be used in a variety of delivery device designs. Exemplary delivery devices include, but are not limited to those described in U.S. Pat. No. 4,147,035 (Schumacher); U.S. Pat. No. 4,506,815 (Melas et al); U.S. Pat. No. 4,915,888 (Jenkins); U.S. Pat. No. 5,755,885 (Mikoshiba et al); and U.S. Pat. No. 8,272,626 (Cunning); and Japanese Pat. App. 3-031477A (Kawasaki). Such delivery devices may be composed of any suitable material that will withstand the conditions of use and will not react with the precursor used. In general, delivery devices are suitably constructed from metal such as nickel and metal alloys such as stainless steel (304, 304 L, 316, 316 L, 321, 347 and 430), and nickel alloys such as INCONEL™, MONEL™, HASTELLOY™. These delivery devices may be any suitable size. The particular size used will depend on various parameters well-known to those skilled in the art, such as the volume of the precursor compounds to be contained within the device, the design of the cabinet or heating bath in which such device will be located during use, and the like.

Figure 5A:
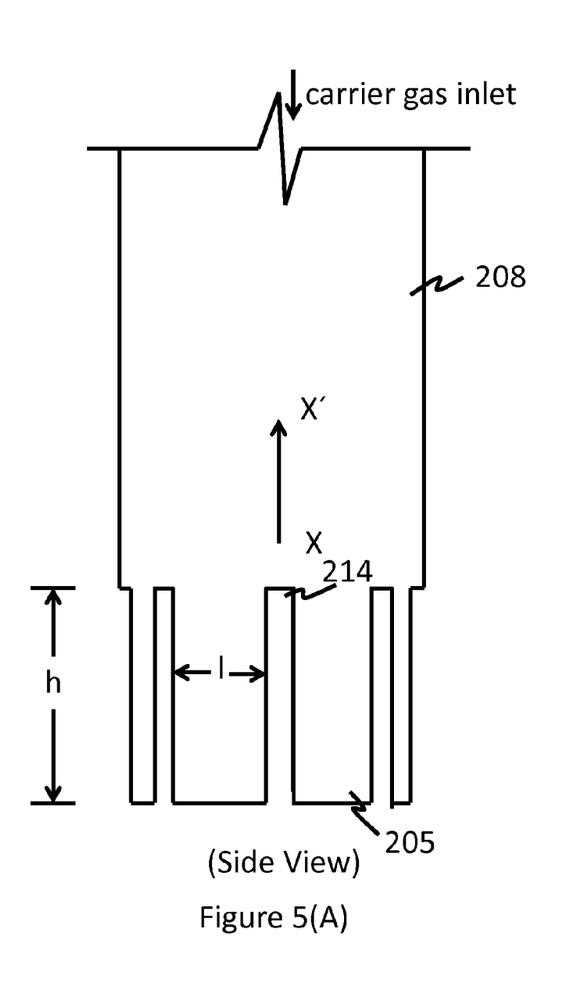
FIG. 5(A) depicts a side view of a slotted sleeve.
Figure 5B:
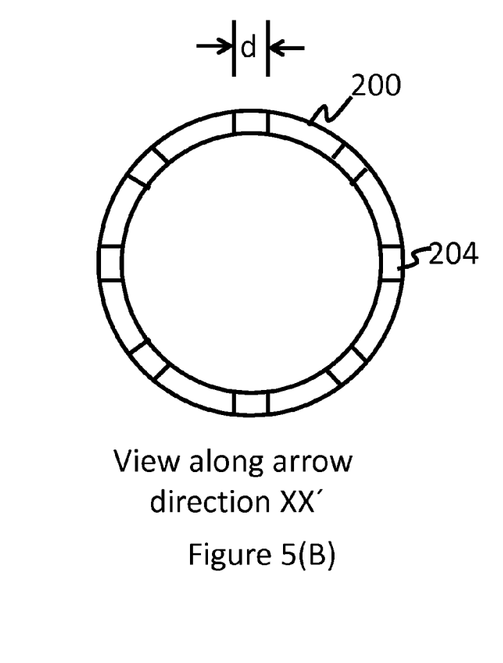
FIG. 5(B) depicts a bottom view of the slotted sleeve.

As noted above, the second end (the lower end) sleeve 208 may have slots or serrations to facilitate a smooth discharge of the carrier gas that minimizes buffeting in the delivery device. FIG. 5 is a depiction of one exemplary embodiment of the sleeve. The FIG. 5(A) is a side view of the slotted sleeve, while the FIG. 5(B) is a bottom view taken along the arrow X-X'. As can be seen in the FIG. 5(A), the sleeve 200 has a plurality of slots 214 in the outlet surface. Each slot 214 has a height "h" and width "d". The area between the slots are termed fins 205. The height is measured from the outlet of the sleeve. The slots may have any suitable height which will function to reduce buffeting as compared to a butt-ended opening. Typically, the height "h" of the slots is 1 to 50 millimeters, specifically 5 to 25 millimeters, and more specifically 10 to 25 millimeters. The slots may have any suitable width which will function to reduce buffeting as compared to a butt-ended opening. Typically, the width "d" is 0.5 to 5 millimeters, specifically 0.75 to 2 millimeters, and more specifically 1 millimeter. The distance between successive slots (i.e., neighboring slots measured along the circumference) is 1 to 10 millimeters, specifically 2 to 8 millimeters, and more specifically 6 millimeters.

The sleeves may have any suitable length. In general, the length of the sleeve is sufficient to convey the carrier gas toward the floor of the delivery device. It will be appreciated by those skilled in the art that once the volume of precursor in the delivery device drops below the outlet end of the sleeve, carrier gas exiting the sleeve no longer directly contacts the liquid precursor. Accordingly, the length of the sleeve is selected so as to minimize the volume of the liquid precursor remaining below the outlet end of the sleeve. In certain embodiments, delivery devices are designed with a well directly under the sleeve, which operates to minimize residual liquid precursor.

Without being limited by theory, the presence of the slots promotes the smooth flow of the carrier gas through the slots, which eliminates buffeting and minimizes bubble size from the sleeve. The presence of slots does not prevent the formation of solids (reaction products of the liquid organometallic compound with moisture or oxygen) due to the presence of the residual impurities in the carrier gas. However, the elimination of buffeting-induced splash-back prevents wetting of inner the surface of the sleeve and thus the formation of solid reaction products inside the sleeve. Solid reaction products may still form outside of the sleeve or dip tube but they are unlikely to find a surface that they can attach to and are simply flushed away to settle at the bottom of the delivery device. Sleeve vibration prevents these solids from securing themselves to the outside or the inside of the sleeve. The solids formed in the delivery device as a result of the presence of the slotted sleeve now settle in non-critical portions of the delivery device and do not constrict carrier gas flow paths. The end of the sleeve having the plurality of slots is sometimes referred to as a castellated sleeve end or castellated injector.

In one embodiment, the fins 205 can be made to vibrate (also presently popularly known as "twerking"). The vibration is taken from the energy in the carrier gas. Without being limited to theory, the energy of the carrier gas that otherwise drives the buffeting will be used to displace the fins causing them to vibrate. The motion of the fins (in addition to the vibration of the sleeve) mechanically impedes the buildup of larger masses of solid product in the sleeve. Ideally any solid product is shaken loose before it interferes with the performance of the delivery device. If the fins are all of the same length, resonance effects can lead to a significant vibration. This vibration is desirable as it "shakes off" the unwanted deposits.

Figure 6A:
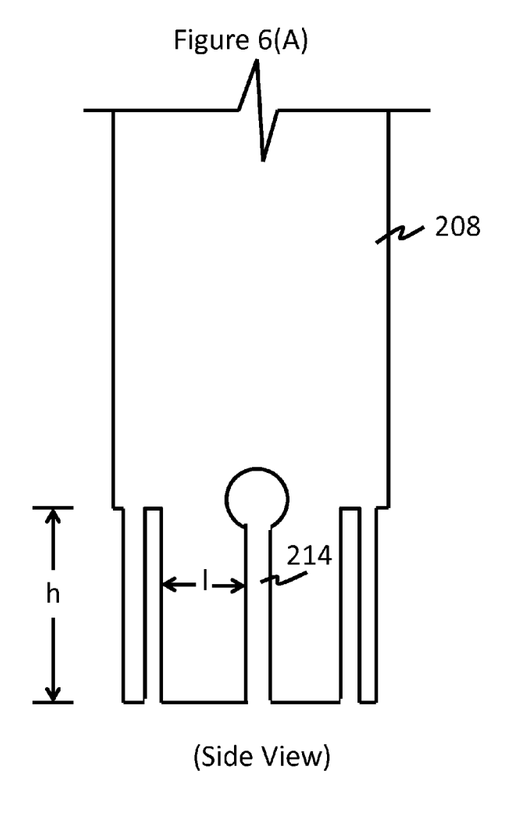
FIGS. 6(A), 6(B) and 6(C) depict different slot designs, where the slot may have different geometries.
Figure 6B:
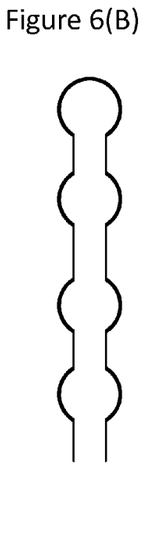
Figure 6C:
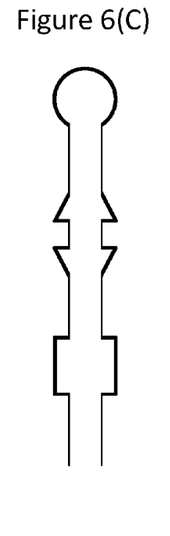

While the slots depicted in the FIG. 5(A) have a generally rectangular shape (i.e., they have three sides, two of which are parallel to each other and perpendicular to the third), other geometric shapes can be combined with the slots. Examples of other geometries are squares, triangles, circles, polygonals, or the like, or a combination thereof. An exemplary design depicted in the FIG. 6(A) shows the slot ending in a circle. For example, the slots may extend from the second end into the sleeve toward the first end and the circle may be positioned at an interior end of the slots. The slot may also comprise a plurality of alternating geometrical shapes. For example, the slot may have a generally rectangular cross-section are as shown in the FIG. 5(A), and may have circular cross-sectional slots alternating with the rectangular cross-sectional area as shown in the FIG. 6(B). FIG. 6(C) depicts different geometrical shapes that alternative with the rectangular cross-sectional area to form the slot.

Figure 7:
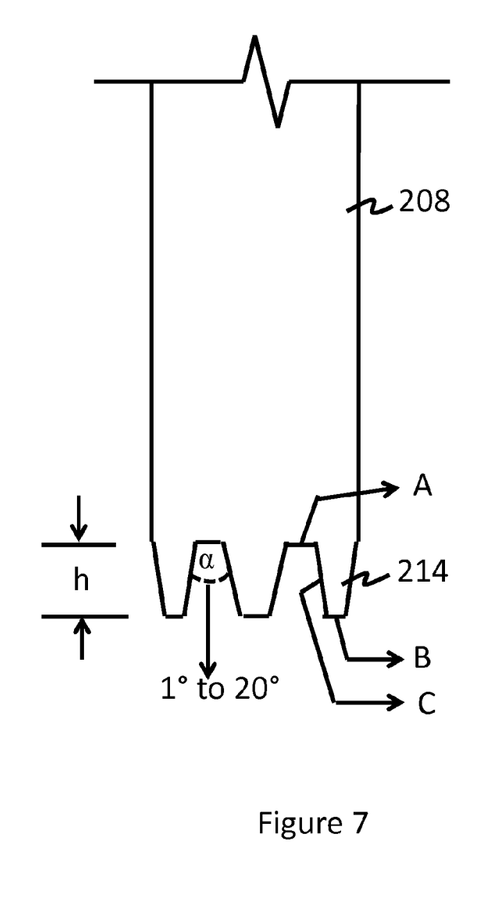
FIG. 7 depicts a sleeve having tapered slots.

In another embodiment, depicted in the FIG. 7, the slots may be tapered, having a narrow width at the top of the slot and a larger width at the bottom of the slot (i.e., at the outlet) when compared with the width at the top of the slot. The tapered slots 206 have an included angle $\alpha$ of 1 degree to 20 degrees, specifically 2 to 10 degrees and more specifically of 3 to 5 degrees. The heights of the slots can be 5 to 50 millimeters.

The edges A and B in the FIG. 7 are all beveled. The beveling is from the inside surface to the outside surface of the dip tube walls, creating a serrated edge at the outer surface. The angle of the bevel is 1 degree to 20 degrees, specifically 2 to 10 degrees, and more specifically 3 to 5 degrees. The slots or beveling can be produced on a milling machine or a slotting machine. Irregular shaped slots can be produced on a milling or drilling machine. After the milling, drilling or slotting operation, any burrs or rough edges may be smoothed and the dip tube may be assembled into a delivery device.

The delivery device contains a precursor liquid or a fluidizable powder, and preferably a liquid. Exemplary precursors are boron tribromide, phosphorous oxychloride, phosphorous tribromide, silicon tetrachloride, dichlorosilane, silicon tetrabromide, arsenic trichloride, arsenic tribromide, antimony pentachloride, trimethylgallium (TMGa), triethylgallium (TEGa), trimethylaluminum (TMAl), ethyldimethylindium, tertiary-butylarsine, tertiary-butylphosphine, silane ($SiH_4$), dichlorosilane ($SiH_2Cl_2$), germanium tetrachloride ($GeCl_4$), stannic chloride ($SnCl_4$), trimethylarsenic $(CH_3)_3As$, trimethylgallium $(CH_3)_3Ga$, triethylgallium $(C_2H_5)_3Ga$, isobutylgermane $(C_4H_7)GeH_3$, diethyltelluride $(C_2H_5)_2Te$, diisopropyltelluride $(C_3H_7)_2Te$, dimethylzinc $(CH_3)_2Zn$, diethylzinc $(C_2H_5)_2Zn$, trimethylantimony $(CH_3)_3Sb$, triethylantimony $(C_2H_5)_3Sb$, trichlorosilane ($SiHCl_3$), ammonia ($NH_3$), boron trichloride ($BCl_3$), chlorine ($Cl_2$), hydrogen chloride (HCl), hydrogen fluoride (HF), chlorine trifluoride ($ClF_3$), trisilane ($Si_3H_8$), or the like, or a combination comprising at least one of the foregoing precursors.

Preferred precursors are germanium tetrachloride ($GeCl_4$), stannic chloride ($SnCl_4$), trimethylarsenic $(CH_3)_3As$, trimethylgallium $(CH_3)_3Ga$, triethylgallium $(C_2H_5)_3Ga$, isobutylgermane $(C_4H_7)GeH_3$, diethyltelluride $(C_2H_5)_2Te$, diisopropyltelluride $(C_3H_7)_2Te$, dimethylzinc $(CH_3)_2Zn$, diethylzinc $(C_2H_5)_2Zn$, trimethylantimony $(CH_3)_3Sb$, triethylantimony $(C_2H_5)_3Sb$, or the like, or a combination comprising at least one of the foregoing precursors, and more preferably trimethylgallium.

In an embodiment, in one method of manufacturing the delivery device of the FIGS. 2, 3 and 4, the dip tube is inserted into the delivery device through an inlet port. A sleeve is forced onto the dip tube and the optional perforated member is then fitted onto the sleeve if desired. The delivery device is then sealed and may be used for delivering a desired ratio of precursor to carrier gas to a reactor without having any blockage occur in the dip tube or in the sleeve. The flexibility of the sleeve facilitates vibration during normal operation of the delivery device and this prevents the build-up of solid reaction products on the inside of the dip tube.

In one method of using the delivery devices of the FIGS. 2 and 3, a carrier gas is charged to the dip tube 200. A carrier gas such as hydrogen, helium, argon, or nitrogen is introduced into the delivery device through the dip tube. The carrier gas travels through the dip tube into the sleeve and to the perforated member. As it emanates from the sleeve or from the optional perforated member, it promotes vibration in the precursor liquid and/or buffeting in the dip tube as has been detailed above. The vibration in the precursor liquid and/or the buffeting of the dip tube promotes vibrations in the sleeve and these vibrations prevent the build-up of reactant products that may otherwise occur on the inside of the sleeve and/or the dip tube. In particular, the buffeting of the dip tube promotes vibrations in the sleeve due to its elasticity and this vibration prevents or breaks up any build-up of reactant products on the inside of the dip tube. The deformation of the tube is temporary and the tube returns to its original shape after the deforming forces are removed. In addition, of the presence of the slots in the dip tube, the carrier gas bubbles emanating from the dip tube are smaller than those bubbles produced when there are no slots in the dip tube. This prevents the build-up of reacted by products on the surface of the dip tube and prevents the constriction of carrier gas flow in the delivery device.

What is claimed is:

1. A delivery device comprising:
   a chamber;
   a gas inlet;
   a gas outlet; and
   a dip tube contained within the chamber and having an upper portion and a lower portion, the upper portion of the dip tube being in fluid communication with the gas inlet and being operative to permit the entry of a carrier gas; the lower portion of the dip tube extending into the chamber, the lower portion of the dip tube terminating in an outlet end; and
   a sleeve; where the sleeve has a first end and a second end; the first end being in an interference fit with the lower portion of the dip tube; where the sleeve vibrates upon being subjected to a disturbance and where the sleeve comprises a metal having a wall-thickness of 0.020 to 0.070 millimeters or an elastomer that vibrates upon being subjected to a disturbance; where the sleeve has slots extending from the second end into the sleeve toward the first end and an interior end of the slots comprises a circular opening.

2. The delivery device of claim 1, where the second end of the sleeve is open ended.

3. The delivery device of claim 1, where the second end of the sleeve is in fluid communication with a perforated member; where the perforated member is downstream of the sleeve and in contact with the sleeve; and where the perforated member is operative to disperse a carrier gas through a volume of a reactant precursor contained in the chamber.

4. The delivery device of claim 1, where the sleeve comprises a metal and returns to an original shape of the sleeve after the disturbance is removed.

5. The delivery device of claim 3, where the second end of the sleeve is in an interference fit with the perforated member.

6. The delivery device of claim 1, where the sleeve comprises electroformed nickel.

7. The delivery device of claim 3, where the perforated member is an inverted shower head that discharges the carrier gas towards a roof of the chamber.

8. The delivery device of claim 6, where the second end of the sleeve is open ended.

9. The delivery device of claim 8, where the slots further comprise holes that have circular, triangular, square or polygonal geometries.

10. The delivery device of claim 8, where the slots have a height as measured from the second end of the sleeve of 5 to 50 millimeters and a width of 0.5 to 5 millimeters.

11. The delivery device of claim 8, where the slots are tapered having an open end with a larger width when compared with a width at the top of the slots.

12. The delivery device of claim 8, where an edge of the slots is beveled.

13. The delivery device of claim 1, where the slots include circular openings spaced along a length of the slots.

14. The delivery device of claim 1, where the slots include triangular openings spaced along a length of the slots.

15. The delivery device of claim 1, where the slots include square openings spaced along a length of the slots.

16. A method comprising:
discharging through a dip tube, a carrier gas into a delivery device that comprises:
- a chamber;
- a gas inlet;
- a gas outlet; and
- a dip tube contained within the chamber and having an upper portion and a lower portion, the upper portion of the dip tube being in fluid communication with the gas inlet and being operative to permit the entry of a carrier gas; the lower portion of the dip tube extending into the chamber, the lower portion of the dip tube terminating in an outlet end; and
- a sleeve; where the sleeve has a first end and a second end; the first end being in an interference fit with the lower portion of the dip tube; where the sleeve vibrates upon being subjected to a disturbance and where the sleeve comprises a metal having a wall-thickness of 0.020 to 0.070 millimeters or an elastomer that vibrates upon being subjected to a disturbance; where the sleeve has slots extending from the second end into the sleeve toward the first end and an interior end of the slots comprises a circular opening;

promoting vibration in the sleeve as the carrier is discharged from the perforated member; and transporting the carrier gas from the gas outlet to a site external to the delivery device.

* * * * *